(12) United States Patent
Nakagawa et al.

(10) Patent No.: US 10,964,531 B1
(45) Date of Patent: Mar. 30, 2021

(54) METHOD OF MANUFACTURING SEMICONDUCTOR DEVICE BY SUPPLYING GAS

(71) Applicant: KOKUSAI ELECTRIC CORPORATION, Tokyo (JP)

(72) Inventors: Takashi Nakagawa, Toyama (JP); Yoshiro Hirose, Toyama (JP); Naofumi Ohashi, Toyama (JP); Tadashi Takasaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/826,844

(22) Filed: Mar. 23, 2020

(30) Foreign Application Priority Data

Sep. 26, 2019 (JP) .............................. JP2019-175993

(51) Int. Cl.
| | |
|---|---|
| *H01L 21/02* | (2006.01) |
| *H01L 21/68* | (2006.01) |
| *C23C 16/34* | (2006.01) |
| *C23C 16/458* | (2006.01) |
| *H01L 21/687* | (2006.01) |
| *C23C 16/44* | (2006.01) |

(52) U.S. Cl.
CPC ...... *H01L 21/02271* (2013.01); *C23C 16/345* (2013.01); *C23C 16/4412* (2013.01); *C23C 16/4584* (2013.01); *H01L 21/0217* (2013.01); *H01L 21/68764* (2013.01); *H01L 21/68771* (2013.01)

(58) Field of Classification Search
CPC ......... H01L 21/02271; H01L 21/68764; H01L 21/68771; C23C 16/4412; C23C 16/4584
USPC .......................................................... 438/782
See application file for complete search history.

(56) References Cited

U.S. PATENT DOCUMENTS

| | | | | |
|---|---|---|---|---|
| 2006/0177579 | A1* | 8/2006 | Shin ....................... | C23C 16/50 427/248.1 |
| 2008/0241384 | A1* | 10/2008 | Jeong .................. | C23C 16/4584 427/255.29 |
| 2014/0090599 | A1* | 4/2014 | Saitou ..................... | B05B 1/005 118/728 |

(Continued)

FOREIGN PATENT DOCUMENTS

JP        2016-042561 A        3/2016

*Primary Examiner* — Didarul A Mazumder
(74) *Attorney, Agent, or Firm* — Volpe Koenig

(57) ABSTRACT

There is provided a technique that includes: substrate mounting plate where substrates are arranged circumferentially; rotator rotating the substrate mounting plate; gas supply structure disposed above the substrate mounting plate from center to outer periphery thereof; gas supplier including the gas supply structure and controlling supply amount of gas supplied from the gas supply structure; gas exhaust structure installed above the substrate mounting plate at downstream side of the gas supply structure in rotation direction; gas exhauster including the gas exhaust structure and controlling exhaust amount of gas exhausted from the gas exhaust structure; and gas main component amount controller including the gas supplier and the gas exhauster and controlling gas main component amount in the gas supplied from the gas supply structure to the substrates and the gas main component amount in the gas supplied to the substrates from the center to the outer periphery of the mounting plate.

16 Claims, 15 Drawing Sheets

(56) References Cited

U.S. PATENT DOCUMENTS

| | | | |
|---|---|---|---|
| 2016/0053373 A1* | 2/2016 | Inada | C23C 16/45591 |
| | | | 118/719 |
| 2018/0245216 A1* | 8/2018 | Ogawa | C23C 16/45527 |
| 2019/0013224 A1* | 1/2019 | Chiba | H01L 21/68764 |
| 2019/0136377 A1* | 5/2019 | Honma | C23C 16/45553 |

* cited by examiner

US 10,964,531 B1

METHOD OF MANUFACTURING SEMICONDUCTOR DEVICE BY SUPPLYING GAS

CROSS-REFERENCE TO RELATED APPLICATION

This application is based upon and claims the benefit of priority from Japanese Patent Application No. 2019-175993, filed on Sep. 26, 2019, the entire contents of which are incorporated herein by reference.

TECHNICAL FIELD

The present disclosure relates to a substrate processing apparatus.

BACKGROUND

In the related art, there is an apparatus which intends to simultaneously improve a throughput and a processing quality, and is configured to supply a gas while revolving a substrate to perform desired substrate processing.

When processing a substrate, it is desirable to uniformly process a surface of the substrate. However, in a case of an apparatus that revolves a substrate, situation of supplying a gas to the substrate may be different between a center side and an outer peripheral side of the apparatus due to restrictions on a form of the apparatus. In that case, it is difficult to perform a uniform in-plane process of the substrate, which leads to a decrease in yield.

SUMMARY

Some embodiments of the present disclosure provide a technique capable of performing a uniform in-plane process of a substrate in an apparatus for processing the substrate while revolving the substrate.

According to an embodiment of the present disclosure, there is provided a technique that includes: a substrate mounting plate on which a plurality of substrates are arranged in a circumferential direction; a rotator configured to rotate the substrate mounting plate; a gas supply structure disposed above the substrate mounting plate from a center to an outer periphery of the substrate mounting plate; a gas supplier including the gas supply structure and configured to control a supply amount of a gas supplied from the gas supply structure; a gas exhaust structure installed above the substrate mounting plate at a downstream side of the gas supply structure in a rotation direction; a gas exhauster including the gas exhaust structure and configured to control an exhaust amount of a gas exhausted from the gas exhaust structure; and a gas main component amount controller including the gas supplier and the gas exhauster and configured to control a gas main component amount in the gas supplied from the gas supply structure to the substrates, wherein the gas main component amount controller is further configured to control the gas main component amount in the gas supplied to the substrates from the center to the outer periphery of the substrate mounting plate.

DETAILED DESCRIPTION

First Embodiment

Figure 1:
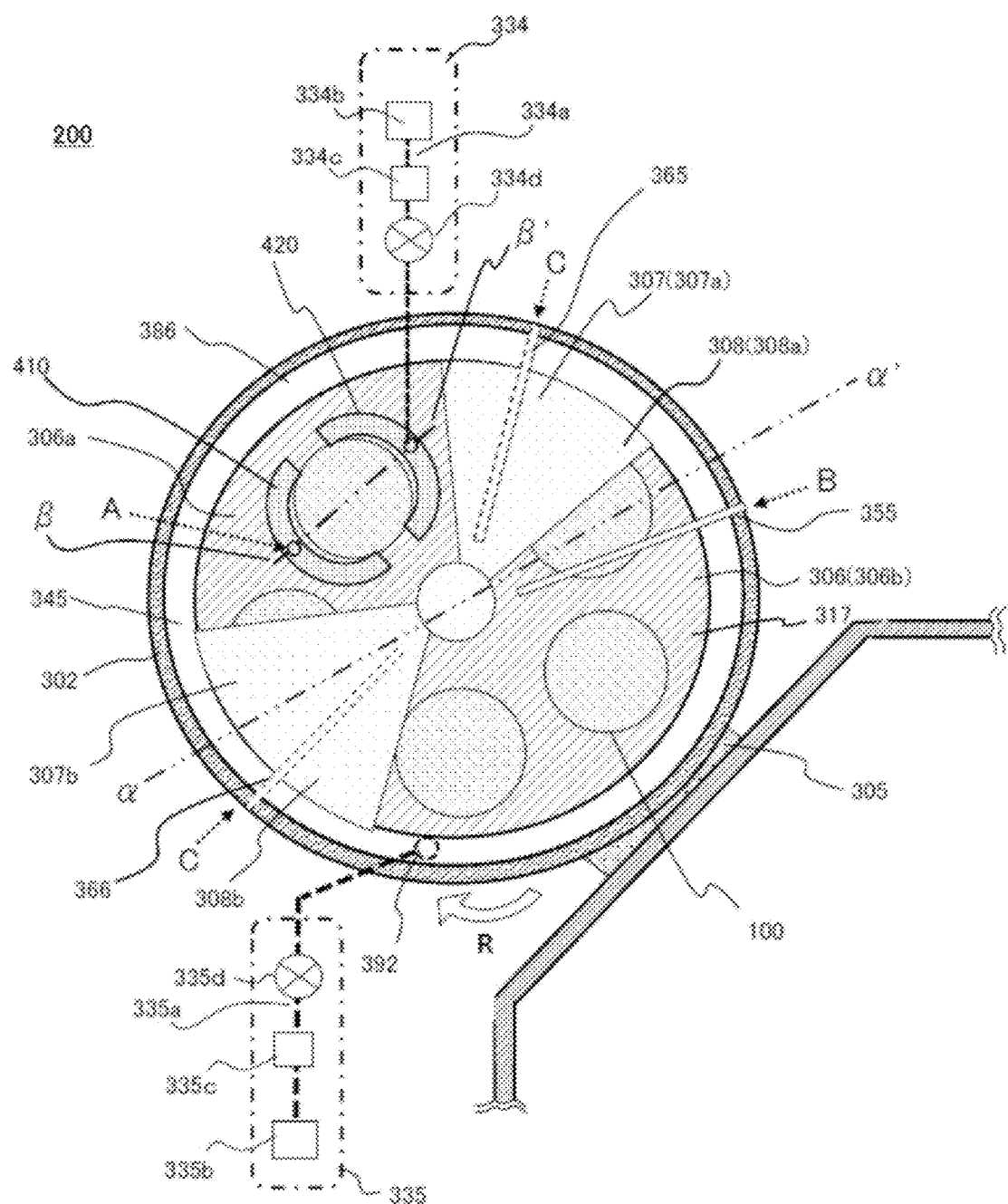
FIG. 1 is an explanatory view for explaining a substrate processing apparatus according to a first embodiment of the present disclosure.
Figure 2:
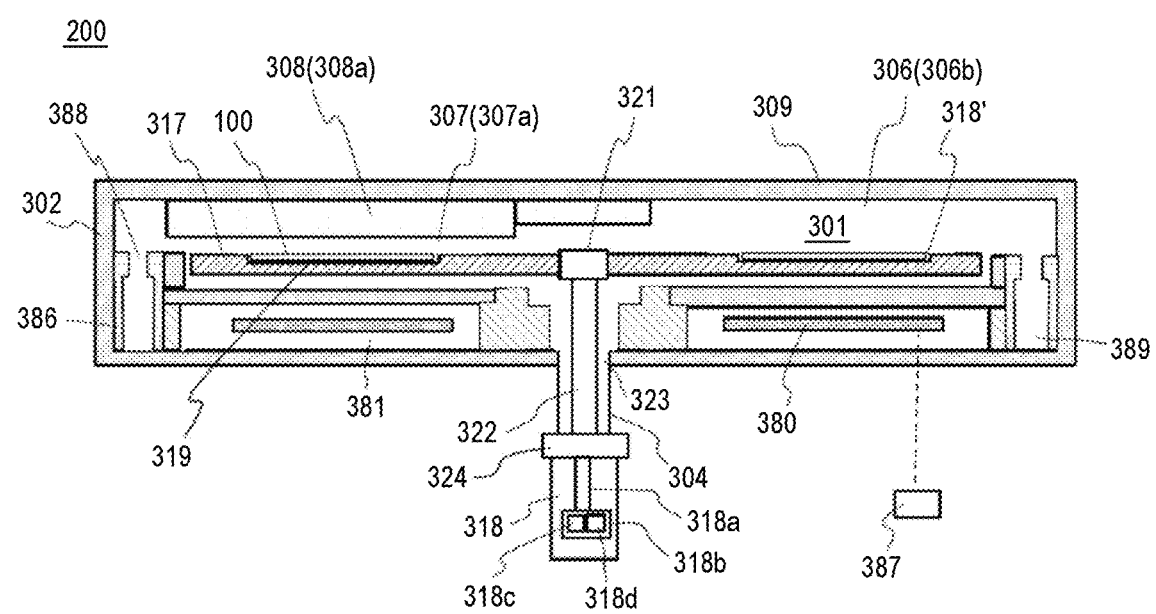
FIG. 2 is an explanatory view for explaining the substrate processing apparatus according to the first embodiment.

A first embodiment will be described with reference to the drawings. The configuration of a substrate processing apparatus according to a first embodiment of the present disclosure will be described mainly with reference to FIGS. 1 and 2. FIG. 1 is a schematic cross-sectional view of a substrate processing apparatus 200 according to the first embodiment. FIG. 2 is a schematic longitudinal cross-sectional view of the substrate processing apparatus 200 according to the first embodiment, which is a cross-sectional view taken along a line α-α' of a chamber 302 illustrated in FIG. 1. The line α-α' is a line directing from α to α' through a center of the chamber 302.

A specific configuration of the substrate processing apparatus 200 will be described. The substrate processing apparatus 200 is controlled by a controller 400 to be described later.

As illustrated in FIGS. 1 and 2, the substrate processing apparatus 200 mainly includes the chamber 302 which is a cylindrical airtight container. A process chamber 301 configured to process a substrate 100 is formed in the chamber 302. A gate valve 305 is connected to the chamber 302, and the substrate 100 is loaded and unloaded through the gate valve 305.

The process chamber 301 includes a processing region 306 into which a processing gas is supplied, and a purge region 307 into which a purge gas is supplied. In this embodiment, the processing region 306 and the purge region 307 are alternately arranged in a circumferential direction. For example, a first processing region 306a, a first purge region 307a, a second processing region 306b and a second purge region 307b are arranged in this order. As will be described later, a first gas is supplied into the first processing region 306a, a second gas is supplied into the second processing region 306b, and an inert gas is supplied into the first purge region 307a and the second purge region 307b. Thus, a predetermined process is performed on the substrate 100 in accordance with the gas supplied into each region. The processing region 306a is also called a first domain, the processing region 306b is also called a second domain, and the first purge region 307a and the second purge region 307b are also called purge domains.

The purge region 307 is a region that spatially separates the first processing region 306a and the second processing region 306b from each other. A ceiling 308 of the purge region 307 is configured to be lower than a ceiling 309 of the processing region 306. A ceiling 308a is provided in the first purge region 307a, and a ceiling 308b is provided in the second purge region 307b. By lowering each ceiling, the pressure in the space of the purge region 307 is increased. By supplying a purge gas into this space, adjacent processing regions 306 are partitioned. Further, the purge gas also has a role of removing an excessive gas on the substrate 100.

A rotatable substrate mounting plate 317 having its rotary shaft at the center of the chamber 302 is installed in the middle of the chamber 302.

The substrate mounting plate 317 is configured such that a plurality of substrates 100 (for example, six substrates 100) can be arranged in the chamber 302 on the same plane and in the same circumferential direction along a rotation direction. The term "same plane" used herein is not limited to a completely same plane, but includes a case where a plurality of substrates 100 are arranged so as not to overlap with each other when the substrate mounting plate 317 is viewed from above.

A concave portion 318' is formed at a position where the substrate 100 is supported on the surface of the substrate mounting plate 317. The same number of concave portions 318' as the number of substrates 100 to be processed are arranged at equal intervals (for example, at intervals of 60 degrees) at concentric positions from the center of the substrate mounting plate 317. In FIG. 1, illustration thereof is omitted for convenience of explanation.

Each concave portion 318' is, for example, circular when viewed from the top of the substrate mounting plate 317 and is concave when viewed from the side thereof. The diameter of the concave portion 318' may be set to be slightly larger than the diameter of the substrate 100. A substrate mounting surface 319 is formed at the bottom of the concave portion 318', and the substrate 100 can be mounted on the substrate mounting surface 319 by mounting the substrate 100 in the concave portion 318'.

The substrate mounting plate 317 is fixed to a core 321. The core 321 is installed at the center of the substrate mounting plate 317 and has a role of fixing the substrate mounting plate 317. A shaft 322 is disposed below the core 321. The shaft 322 supports the core 321.

The lower part of the shaft 322 passes through a hole 323 formed at the bottom of the chamber 302 and is covered with a container 304 that can be airtight outside the chamber 302. An elevating/rotating part 318 is installed at the lower end of the shaft 322. When the shaft 322 is not elevated, the elevating/rotating part 318 is simply referred to as a rotating part (or rotator) 318. The elevating/rotating part 318 is configured to rotate and elevate the substrate mounting plate 317 according to an instruction from the controller 400.

A heater unit 381 including a heater 380 as a heating part is disposed below the substrate mounting plate 317. The heater 380 heats each of the substrates 100 mounted on the substrate mounting plate 317. The heater 380 is disposed circumferentially along the shape of the chamber 302.

A heater control part 387 is connected to the heater 380. The heater 380 is electrically connected to the controller 400 and controls supply of power to the heater 380 according to an instruction from the controller 400 to perform temperature control.

An exhaust structure 386 is disposed on the outer periphery of the substrate mounting plate 317. The exhaust structure 386 includes an exhaust groove 388 and an exhaust buffer space 389. The exhaust groove 388 and the exhaust buffer space 389 are formed circumferentially along the shape of the chamber 302.

An exhaust port 392 is installed at the bottom of the exhaust structure 386. The exhaust port 392 mainly exhausts the second gas supplied into the processing space 306b and the purge gas supplied from the upstream thereof. Each gas is exhausted from the exhaust structure 391 and the exhaust port 392 via the exhaust groove 388 and the exhaust buffer space 389.

Subsequently, a gas supply part (or a gas supplier) will be described. As illustrated in FIG. 1, the chamber 302 includes a gas supply structure 410. The gas supply structure 410 is disposed above the substrate mounting plate 317. Further, the chamber 302 includes nozzles 355, 365 and 366. "A" in FIG. 1 is connected to "A" in FIG. 3A. That is, the gas supply structure 410 is connected to a supply pipe 241. "B" in FIG. 1 is connected to "B" in FIG. 3B. That is, the nozzle 355 is connected to a supply pipe 251. "C" in FIG. 1 is connected to "C" in FIG. 3C. That is, the nozzles 365 and 366 are connected to a supply pipe 261.

Figure 3A:
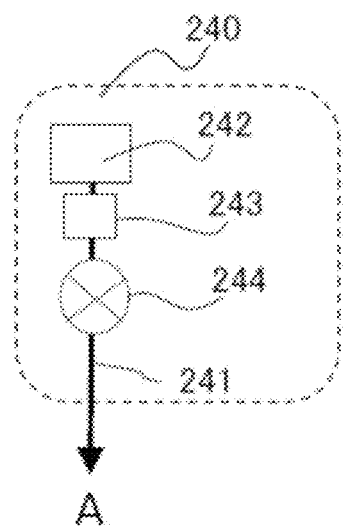
FIGS. 3A to 3C are explanatory views for explaining a gas supply part according to the first embodiment.
Figure 3B:
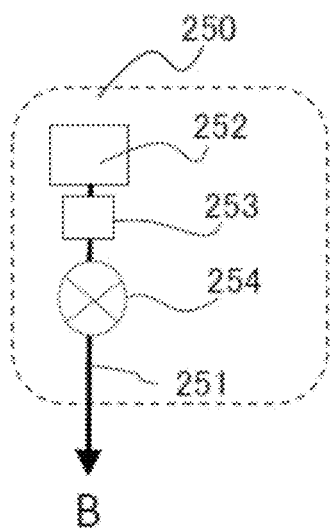
Figure 3C:
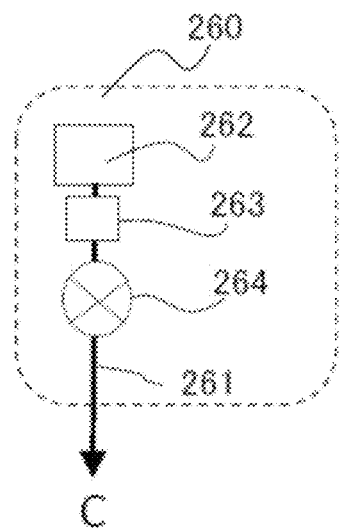

Subsequently, the gas supply part will be described with reference to FIGS. 3A to 3C. FIG. 3A illustrates a first gas supply part 240 which is a part of the gas supply part. The details thereof will be described with reference to FIG. 3A. The first gas is mainly supplied from the first gas supply pipe 241.

At the first gas supply pipe 241, a first gas supply source 242, an MFC 243, which is a flow rate controller (flow rate control part), and a valve 244 which is an opening/closing valve are installed in order from the upstream side.

A gas containing a first element (hereinafter referred to as the "first gas") is supplied from the first gas supply pipe 241 to a shower head 230 via the MFC 243, the valve 244 and the first gas supply pipe 241.

The first gas is a precursor gas, that is, one of processing gases. In this embodiment, the first element is, for example, silicon (Si). That is, the first gas is a Si gas (also referred to as a Si-containing gas), which is a gas containing Si as a main component. Specifically, a dichlorosilane ($SiH_2Cl_2$, abbreviation: DCS) gas is used as the first gas.

If the first gas is liquid at normal temperature and normal pressure, a vaporizer (not shown) may be installed between the first gas supply source 242 and the MFC 243. Here, the description will be made with the first gas as a gas.

The first gas supply part 240 mainly includes the first gas supply pipe 241, the MFC 243, the valve 244 and the gas supply structure 410. Further, the first gas supply part 240 may include the first gas supply source 242.

Subsequently, a second gas supply part 250 which is a part of the gas supply part will be described with reference to FIG. 3B. At the second gas supply pipe 251, a second gas supply source 252, an MFC 253, which is a flow rate controller, and a valve 254 are installed in order from the upstream side.

Then, a reaction gas reacting with the first gas is supplied from the second gas supply pipe 251 into the shower head 230. The reaction gas is also called a second gas. The second gas is one of the processing gases, for example, a nitrogen-containing gas containing nitrogen as a main component. For example, an ammonia ($NH_3$) gas is used as the nitrogen-containing gas.

The second gas supply part 250 mainly includes the second gas supply pipe 251, the MFC 253, the valve 254 and the nozzle 355. Since the second gas supply part 250 is configured to supply the reaction gas, it is also referred to as a reaction gas supply part. Further, the second gas supply part 250 may include the second gas supply source 252.

Subsequently, a purge gas supply part 260 which is a part of the gas supply part will be described with reference to FIG. 3C. At the purge gas supply pipe 261, a purge gas supply source 262, an MFC 263, which is a flow rate controller (flow rate control part), and a valve 264 are installed in order from the upstream side.

Then, a purge gas is supplied from the purge gas supply pipe 261 into the shower head 230. The purge gas is a gas that does not react with the first gas or the second gas, which is one of purge gases for purging the internal atmosphere of the process chamber 201, for example, a nitrogen ($N_2$) gas.

The purge gas supply part 260 mainly includes the purge gas supply pipe 261, the MFC 263, the valve 264, the nozzle 365 and the nozzle 366. The purge gas supply part 260 may include the purge gas supply source 262.

The first gas supply part 240, the second gas supply part 250 and the purge gas supply part 260 are collectively referred to as a gas supply part.

Next, a gas exhaust part (or gas exhauster) will be described. The chamber 302 is provided with a gas exhaust structure 420 and an exhaust port 392. The gas exhaust structure 420 is disposed above the substrate mounting plate 317. An exhaust pipe 334a is installed so as to communicate with the gas exhaust structure 420. A vacuum pump 334b, which is a vacuum exhaust device, is connected to the exhaust pipe 334a via a valve 334d, which is an opening/closing valve, and an auto pressure controller (APC) valve 334c which is a pressure regulator (pressure adjustment part). The vacuum pump 334b is configured to vacuum-exhaust the interior of the process chamber 301 so that the internal pressure of the process chamber 301 becomes a predetermined pressure (degree of vacuum).

The exhaust pipe 334a, the valve 334d, the APC valve 334c and the gas exhaust structure 420 are collectively referred to as a first gas exhaust part 334. The first gas exhaust part 334 may include the vacuum pump 334b.

In addition, a second gas exhaust part 335 is installed so as to communicate with the exhaust port 392. The exhaust port 392 is formed on the downstream side of the processing region 306b in the rotation direction. The second gas exhaust part 335 mainly exhausts the second gas and the inert gas.

An exhaust pipe 335a, which is a part of the second gas exhaust part 335, is installed so as to communicate with the exhaust port 392. A vacuum pump 335b, which is a vacuum exhaust device, is connected to the exhaust pipe 335a via a valve 335d, which is an opening/closing valve, and an APC valve 335c which is a pressure regulator (pressure adjustment part). The vacuum pump 335b is configured to vacuum-exhaust the interior of the process chamber 301 so that the internal pressure of the process chamber 301 becomes a predetermined pressure (degree of vacuum).

The exhaust pipe 335a, the valve 335d and the APC valve 335c are collectively referred to as a second gas exhaust part 335. The second gas exhaust part 335 may include the vacuum pump 335b.

The first gas supply part 240 and the first gas exhaust part 334 are collectively referred to as a first gas main component amount control part (or a first gas main component amount controller). The first gas main component amount control part controls an amount of gas main component in the first gas supplied to the substrate that passes below the gas supply structure 410 and the gas exhaust structure 420 by using one of the first gas supply part 240 and the first gas exhaust part 334 or interlocking of the two parts 240 and 334.

The second gas supply part 250 and the second gas exhaust part 335 are collectively referred to as a second gas main component amount control part (or a second gas main component amount controller). The second gas main component amount control part controls an exposure amount of the second gas supplied to the substrate that passes below the nozzle 355 by using one of the second gas supply part 250 and the second gas exhaust part 335 or interlocking of the two parts 250 and 335.

Figure 4:
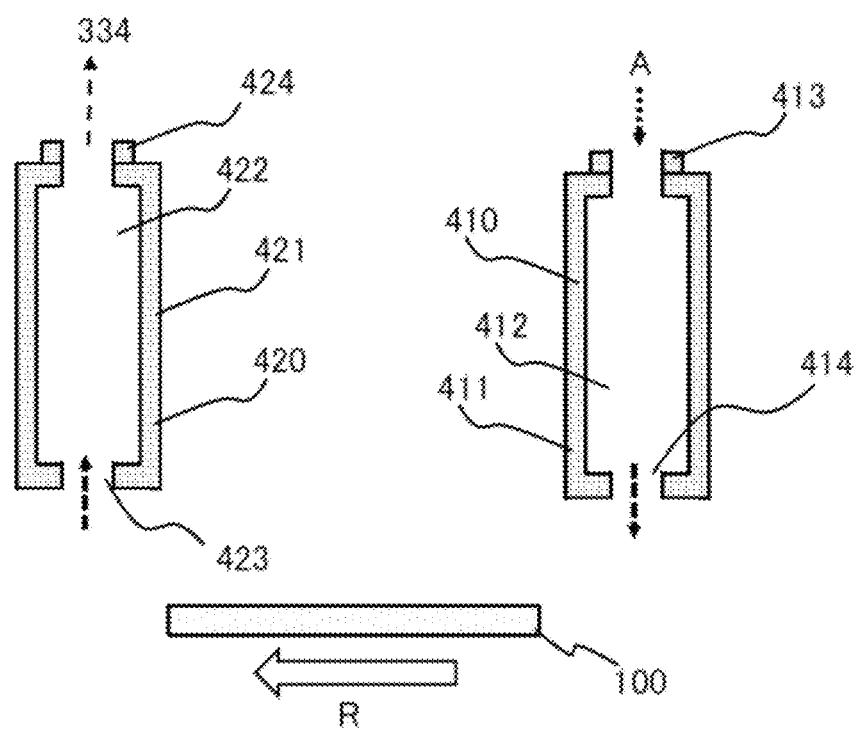
FIG. 4 is an explanatory view for explaining a gas supply structure and a gas exhaust structure according to the first embodiment.

Next, a relationship between the gas supply structure 410 and the gas exhaust structure 420 will be described with reference to FIGS. 1, 4 and 5. FIG. 4 is an explanatory view of the gas supply structure 410 and the gas exhaust structure 420 as viewed from the outer periphery of the substrate mounting plate 317 toward the center thereof "R" in FIG. 4 is the same as "R" in FIG. 1 and denotes the rotation direction of the substrate mounting plate 317.

Figure 5:
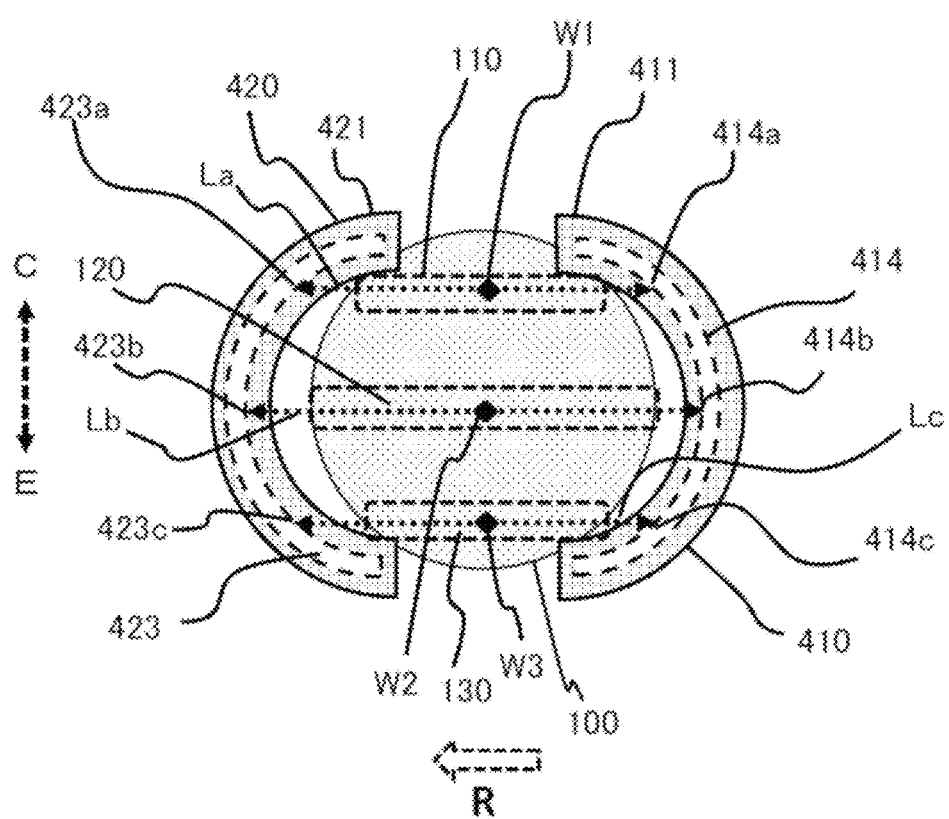
FIG. 5 is an explanatory view for explaining the gas supply structure and the gas exhaust structure according to the first embodiment.

FIG. 5 is an explanatory view of the gas supply structure 410 and the gas exhaust structure 420 as viewed from above. In FIG. 5, the direction of an arrow C indicates the center side of the substrate mounting plate 317, and the direction of an arrow E indicates the outer peripheral side of the substrate mounting plate 317. "R" in FIG. 5 is the same as "R" in FIG. 1 and denotes the rotation direction of the substrate mounting plate 317. In FIG. 5, W1, W2 and W3 denote arbitrary locations on the substrate 100. W2 denotes the center position of the substrate 100, W1 denotes a position of the substrate 100 closer to the center side of the substrate mounting plate 317 than W2, and W3 denotes a position of the substrate 100 closer to the outer periphery of the substrate mounting plate 317 than W2.

The gas supply structure 410 mainly includes a housing 411. A buffer space 412 is formed inside the housing 411. A hole 413 is formed above the buffer space 412, and a hole 414 is formed below the buffer space 412. The hole 413 communicates with the supply pipe 241. A gas supplied from the first gas supply part 240 is supplied to the substrate 100 via the hole 413, the buffer space 412 and the hole 414.

The gas exhaust structure 420 mainly includes a housing 421. A buffer space 422 is formed inside the housing 421. A hole 423 is formed below the buffer space 422, and a hole 424 is formed above the buffer space 422. The hole 424 communicates with the first gas exhaust part 334. A gas supplied from the gas supply structure 410 is exhausted through the hole 423, the buffer space 422 and the hole 424.

As illustrated in FIG. 5, when the gas supply structure 410 is viewed from above, the housing 411 is formed in a U-shape with the gas exhaust structure 420 side released. As indicated by a dotted line in FIG. 5, the hole 414 is formed along the outer peripheral shape of the substrate 100. The hole 414 has a U-shape with the exhaust structure 420 side released in the same manner as the housing 411. In this embodiment, a continuous hole shape is used. However, a structure in which a plurality of holes are arranged along the outer periphery of the substrate 100 may be used.

When the gas exhaust structure 420 is viewed from above, the housing 421 is formed in a U-shape with the gas supply structure 410 side released. The hole 423 is formed along the shape of the housing 421. As indicated by a dotted line in FIG. 5, the hole 423 is formed along the outer peripheral shape of the substrate 100. The hole 423 has a U-shape with the supply structure 410 side released, in the same manner as the housing 421. In this embodiment, a continuous hole shape is used. However, a structure in which a plurality of holes are arranged along the outer periphery of the substrate may be used.

As will be described later, the substrate 100 is in a state where many grooves are formed. In this case, a film is formed on the surface of a pillar that forms a wall of the groove. The grooves are formed on the entire surface of the substrate 100. Therefore, when the surface of the substrate 100 is divided into a plurality of regions in a direction perpendicular to a moving direction of the substrate 100, the surface area is different between a middle region of the substrate 100 and a lateral region of the substrate 100. In FIG. 5, the surface area is different among a lateral region 110, which is on the center side of the substrate mounting plate 317 and includes the point W1, a middle region 120, which includes the point W2, and a lateral region 110 which is on the outer peripheral side of the substrate mounting plate 317 and includes the point W3.

More specifically, the surface area of the middle region 120 is larger than the surface area of each of the lateral regions 110 and 130. This is because a length of the moving direction of the substrate 100 in the middle region 120 is larger than a length of the moving direction of the substrate 100 in the lateral regions 110 and 130. It is assumed that the regions have the same width in the direction perpendicular to the moving direction.

As a result of intensive studies, the inventors have found that a gas consumption is proportional to the surface area of the substrate 100. Therefore, the region 120 having the largest surface area has the largest gas consumption. The region 110 and the region 120 have a gas consumption smaller than that of the region 120.

Therefore, in the present technique, a gas supply amount, that is, an amount of the main component of the gas is set according to the gas consumption. Specifically, in the substrate 100, the distance between the hole 414 of the gas supply structure 410 and the hole 423 of the gas exhaust structure is set to a distance corresponding to the length of the substrate 100 so that a gas supply time according to the length in the moving direction is obtained.

For example, in the region 120, a distance between the hole 414 and the hole 423 (a distance Lb between 414b and 423b in FIG. 5, also referred to as a first distance) is set to a predetermined distance corresponding to the length of the region 120. Further, in the region 110, a distance between the hole 414 and the hole 423 (a distance La between 414a and 423a in FIG. 5, also referred to as a second distance) is set to a distance corresponding to the length of the region 110. As described above, since the surface area of the region 120 is larger than that of the region 110, the distance La is smaller than the distance Lb.

When the width of the region 110 is equal to the width of the region 130, the distance La is set to be equal to a distance Lc.

In this way, since the distance between the supply hole and the exhaust hole is set in accordance with the length of the substrate 100 in the traveling direction, a gas does not run out in any region on the substrate, and therefore, it is possible to perform uniform processing in the surface of the substrate.

Figure 6:
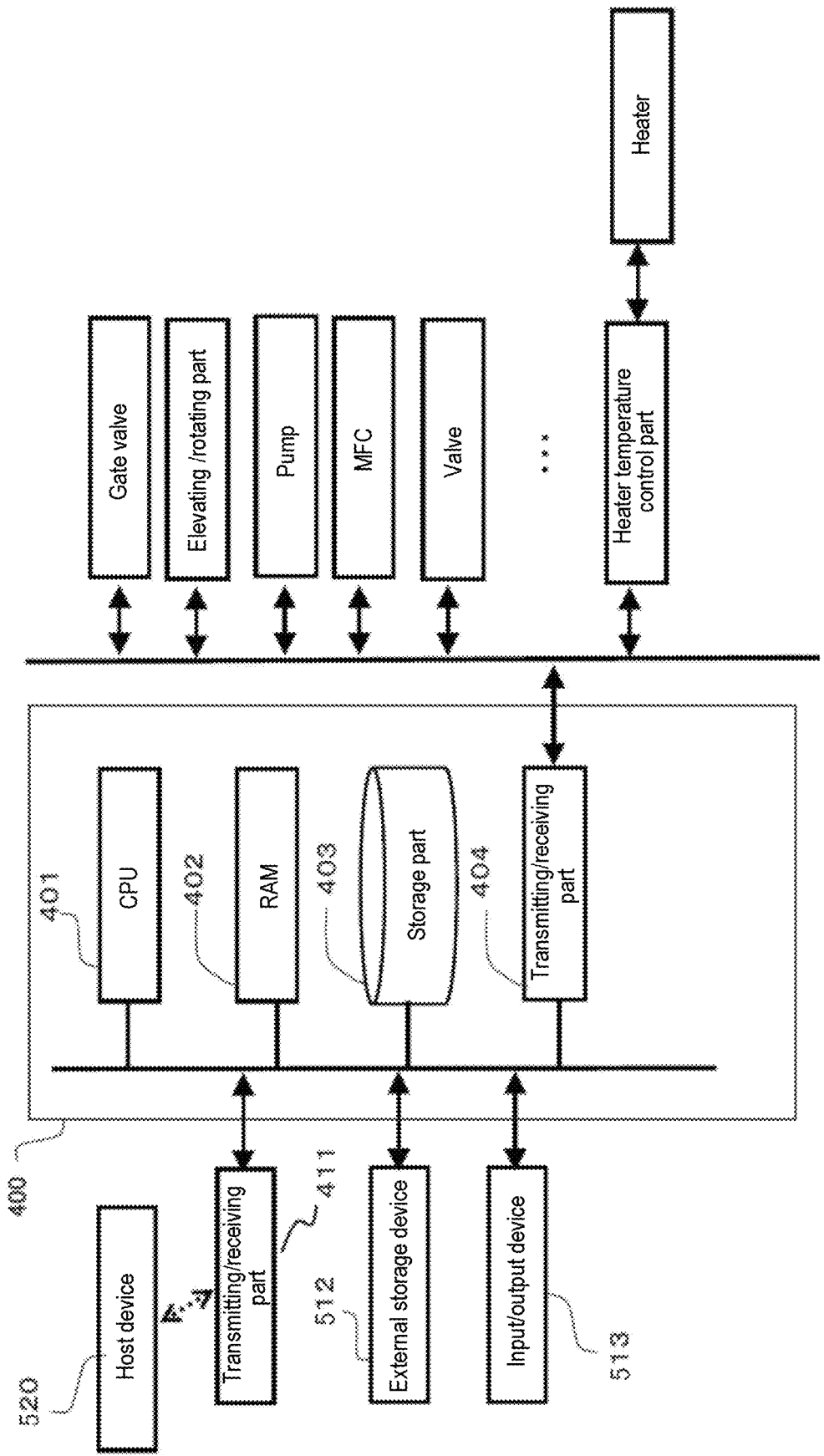
FIG. 6 is an explanatory view for explaining a controller of the substrate processing apparatus according to the first embodiment.

Subsequently, the controller 400 will be described with reference to FIG. 6. The substrate processing apparatus 200 includes the controller 400 that controls operations of respective parts of the substrate processing apparatus 200. The controller 400 includes at least an arithmetic part (CPU) 401, a non-transitory storage part 402, a storage part 403 and a transmitting/receiving part 404. The controller 400 is connected to the respective parts of the substrate processing apparatus 200 via the transmitting/receiving part 404, calls a program or a recipe from the storage part 403 in accordance with an instruction from a higher-level controller or a user, and controls the operations of the respective parts according to contents of the called program or recipe. The controller 400 may be configured as a dedicated computer or a general-purpose computer. For example, the controller 400 according to the present embodiment may be configured by providing an external storage device (for example, a magnetic tape, a magnetic disk such as a flexible disk or a hard disk, an optical disk such as a CD or a DVD, a magneto-optical disk such as an MO, a semiconductor memory such as a USB memory (USB Flash Drive) or a memory card, etc.) 412 storing the above-described program and installing, on the general-purpose computer, a program using the external storage device 512. The means for supplying the program to the computer is not limited to the case where the program is supplied via the external storage device 512. For example, a communication means such as the Internet or a dedicated line may be used, or information may be received from a host device 520 via the transmitting/receiving part 404 and the program may be supplied without passing through the external storage device 512. Further, the controller 400 may be instructed using an input/output device 513 such as a keyboard or a touch panel.

The storage part 402 and the external storage device 512 are configured as a computer-readable recording medium. Hereinafter, these are collectively referred to simply as a recording medium. In the present disclosure, when the term "recording medium" is used, it may include the storage part 402 alone, the external storage device 512 alone, or both.

(Substrate Processing Flow)

Figure 7:
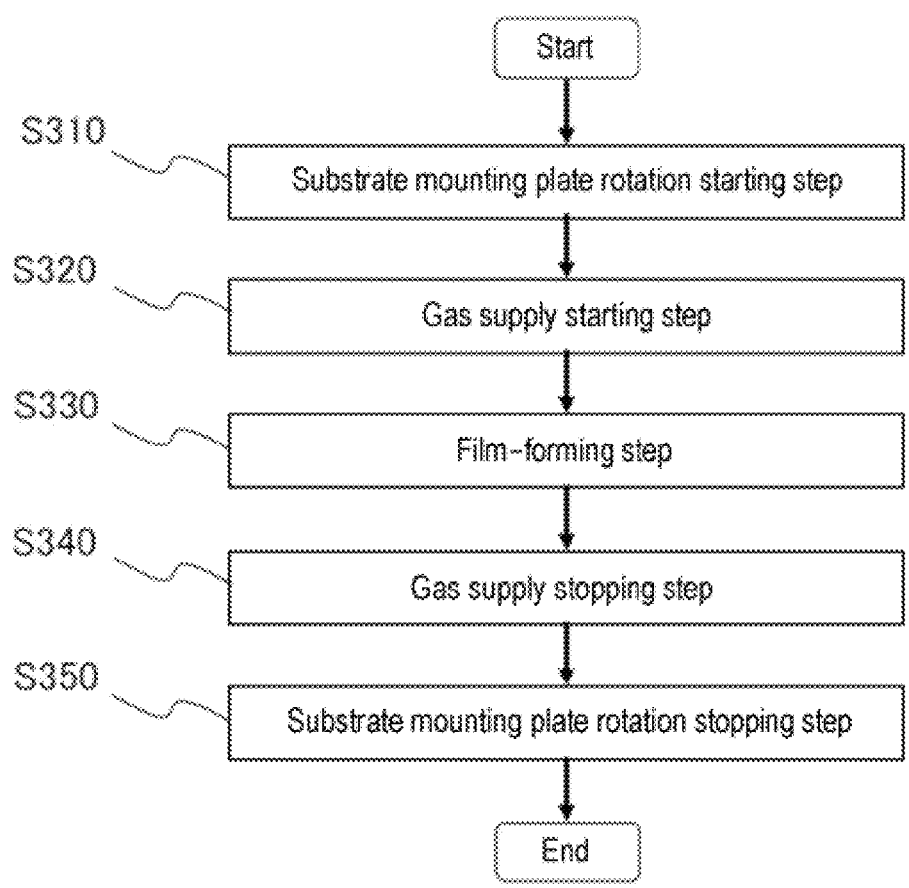
FIG. 7 is an explanatory view for explaining a substrate processing flow according to the first embodiment.
Figure 8:
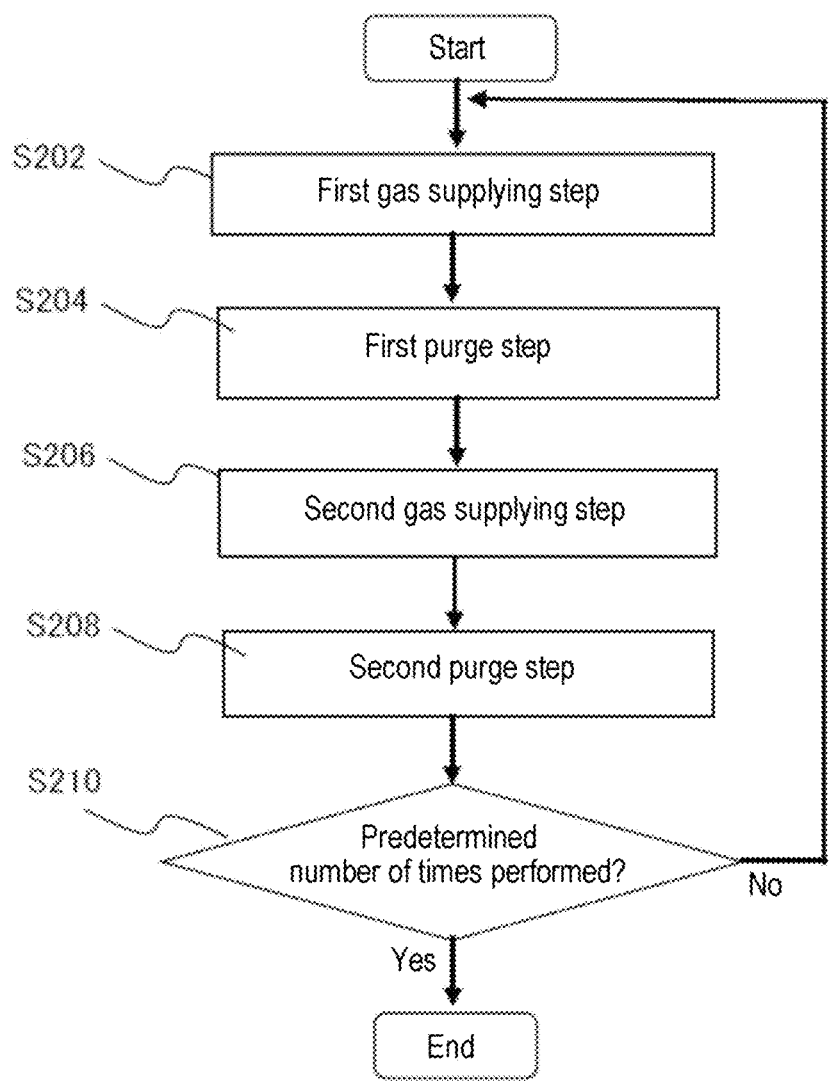
FIG. 8 is an explanatory view for explaining the substrate processing flow according to the first embodiment.

Next, a substrate processing flow will be described with reference to FIGS. 7 and 8. FIG. 7 is a flowchart illustrating a substrate processing flow according to the present embodiment. FIG. 8 is a flowchart illustrating details of a film-forming step S330. In the following description, the operations of respective parts of the substrate processing apparatus 200 are controlled by the controller 400.

Here, an example in which a silicon-containing gas is used as the first gas, an ammonia gas is used as the second gas, and a silicon nitride (SiN) film is formed as a thin film on the substrate 100 will be described.

A substrate loading/mounting step will be described. Illustration thereof is omitted in FIG. 7. The substrate mounting plate 317 is rotated to move the concave portion 318' to a position facing the gate valve 305. Next, lift pins (not shown) are lifted up to pass through through-holes (not shown) of the substrate mounting plate 317. Subsequently, the gate valve 305 is opened such that the chamber 302 communicates with a vacuum transfer chamber (not shown). Then, the substrate 100 is transferred from the transfer chamber onto the lift pins using a wafer transfer device (not shown), and then the lift pins are moved down. As a result, the substrate 100 is held in a horizontal posture on the concave portion 318'.

Figure 9:
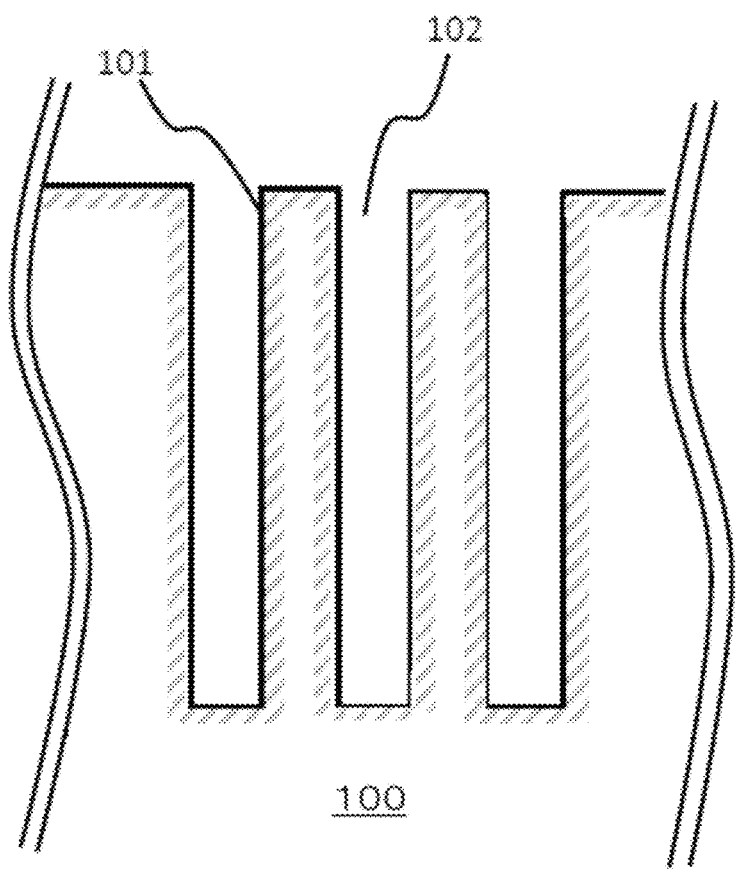
FIG. 9 is an explanatory view for explaining a state of a substrate to be processed in the first embodiment.

As illustrated in FIG. 9, a plurality of pillars 101 and extremely narrow grooves 102 each having a high aspect ratio and formed between the pillars 101 are formed in the loaded substrate 100. In this substrate processing flow, a film is formed on a surface of the pillar 101.

When the substrate 100 is supported on the concave portion 318', the substrate mounting plate 317 is rotated so that a concave portion 318' on which the substrate 100 is not mounted faces the gate valve 305. Thereafter, similarly, the substrate is placed on the concave portion 318'. The flow is repeated until the substrate 100 is placed on all the concave portions 318'.

After the substrate 100 is placed on each of the concave portions 318', the substrate transfer device is retracted outside the substrate processing apparatus 200, and the gate valve 305 is closed to seal the interior of the chamber 302.

When the substrate 100 is mounted on the substrate mounting plate 317, electric power is supplied to the heater 380 in advance to control the surface of the substrate 100 to be at a predetermined temperature. The temperature of the substrate 100 is, for example, 400 degrees C. or more and 500 degrees C. or less. The heater 380 is kept energized at least in a period from the time of the substrate loading/mounting step to the end of a substrate unloading step to be described later.

A substrate mounting plate rotation starting step S310 will be described. When the substrate 100 is placed in each concave portion 318', the rotating part 324 rotates the substrate mounting plate 317 in the R direction. By rotating the substrate mounting plate 317, the substrate 100 is moved in the order of the first processing region 306a, the first purge region 307a, the second processing region 306b and the second purge region 307b.

A gas supply starting step S320 will be described. When the substrate 100 is heated to reach a desired temperature and the substrate mounting plate 317 reaches a desired rotation speed, the valve 244 is opened to start supplying a silicon-containing gas into the first processing region 306a. At the same time, the valve 254 is opened to supply an $NH_3$ gas into the second processing region 306b.

At this time, the MFC 243 is adjusted so that a flow rate of the silicon-containing gas becomes a predetermined flow rate. The supply flow rate of the silicon-containing gas is, for example, 50 sccm or more and 500 sccm or less.

In addition, the MFC 253 is adjusted so that the flow rate of the $NH_3$ gas becomes a predetermined flow rate. The supply flow rate of the $NH_3$ gas is, for example, 100 sccm or more and 5,000 sccm or less.

After the substrate loading/mounting step S310, subsequently, the interior of the process chamber 301 is exhausted by the first gas exhaust part 334 and the second gas exhaust part 335, and an $N_2$ gas as a purge gas is supplied from the inert gas supply part 260 into the first purge region 307a and the second purge region 307b.

A film-forming step S330 will be described. Here, a basic flow of the film-forming step S330 will be described, and the details thereof will be described later. In the film-forming step S330, in each substrate 100, a silicon-containing layer is formed in the first processing region 306a, and further, the silicon-containing layer reacts with the $NH_3$ gas in the rotated second processing region 306b to thereby form a silicon-containing film on the substrate 100. The substrate mounting plate 317 is rotated a predetermined number of times so that the silicon-containing film has a desired film thickness.

A gas supply stopping step S340 will be described. After the substrate mounting plate 317 is rotated the predetermined number of times, the valves 244 and 254 are closed to stop the supply of the silicon-containing gas into the first processing region 306a and the supply of the $NH_3$ gas into the second processing region 306b.

A substrate mounting plate rotation stopping step S350 will be described. After the gas supply stopping step S340, the rotation of the substrate mounting plate 317 is stopped.

A substrate unloading step will be described. Illustration thereof is omitted in FIG. 7. The substrate mounting plate is rotated to move the substrate 100 to be unloaded to a position facing the gate valve 305. After that, the substrate is unloaded in reverse as compared with the method of loading the substrate. These operations are repeated until all the substrates 100 are unloaded.

Subsequently, the details of the film-forming step S330 will be described with reference to FIG. 8. FIG. 8 is a flowchart with one substrate as the subject. During the film-forming step S330, a plurality of substrates 100 are sequentially passed through the first processing region 306a, the first purge region 307a, the second processing region 306b and the second purge region 307b by the rotation of the substrate mounting plate 317.

A first gas supplying step S202 will be described. In the first gas supplying step S202, a silicon-containing gas is supplied to the substrate 100 when the substrate 100 passes through the first processing region 306a. The supplied silicon-containing gas is decomposed to form a silicon-containing layer in the groove 102.

A first purge step S204 according to the present embodiment will be described. The substrate 100 is moved to the first purge region 307a after passing through the first processing region 306a. When the substrate 100 passes through the first purge region 307a, the component 104 of the silicon-containing gas that could not form a strong coupling on the substrate 100 in the first processing region 306a is removed from the substrate 100 by an inert gas.

A second gas supplying step S206 will be described. The substrate 100 is moved to the second processing region 306b after passing through the first purge region 307a. The silicon-containing gas component in the groove 102 reacts with the $NH_3$ gas component, and a cut silicon-containing gas component and the $NH_3$ gas component are coupled to form a silicon-containing layer having a degree of coupling.

A second purge step S208 will be described. After passing through the second processing region 306b, the substrate 100 is moved to the second purge region 307b. When the substrate 100 passes through the second purge region 307b, a HCl or $NH_4Cl$ gas desorbed from the layer on the substrate 100 in the second processing region 306c or a surplus gas is removed from the substrate 100 by an inert gas.

In this way, at least two second gases that react with each other are sequentially supplied to the substrate. The above-described first gas supplying step S202, first purge step S204, second gas supplying step S206 and second purge step S208 are defined as one cycle.

A determining step S210 will be described. The controller 400 determines whether the one cycle has been performed a predetermined number of times. Specifically, the controller 400 counts the number of rotations of the substrate mounting plate 317.

When the one cycle has not been performed a predetermined number of times ("NO" in S210), the rotation of the substrate mounting plate 317 is further continued to repeat the cycle including the first gas supplying step S202, the first purge step S204, the second gas supplying step S206 and the second purge step S208. A thin film is formed by laminating layers in this manner.

When the one cycle has been performed a predetermined number of times ("YES" in S210), the film-forming step S330 is ended. In this manner, by performing the one cycle a predetermined number of times, a laminated thin film having a predetermined thickness is formed. Thus, a film is formed in the groove 102.

As described above, since the amount (i.e., concentration) of gas main component can be adjusted according to the state of the substrate (the surface area of the substrate in this embodiment), uniform processing can be performed on the surface of the substrate, which can lead to increase in yield.

The gas supply structure 410 and the gas exhaust structure 420 may be replaceable according to the state of the substrate. For example, when information on the surface area of a substrate to be processed next is received, the gas supply structure 410 and the gas exhaust structure 420 are replaced according to the surface area.

Second Embodiment

Subsequently, a second embodiment will be described. The second embodiment is different from the first embodiment in terms of the gas supply structure and the gas exhaust structure of the processing region 306a. Other configurations are the same. Hereinafter, the differences will be mainly described.

Figure 10:
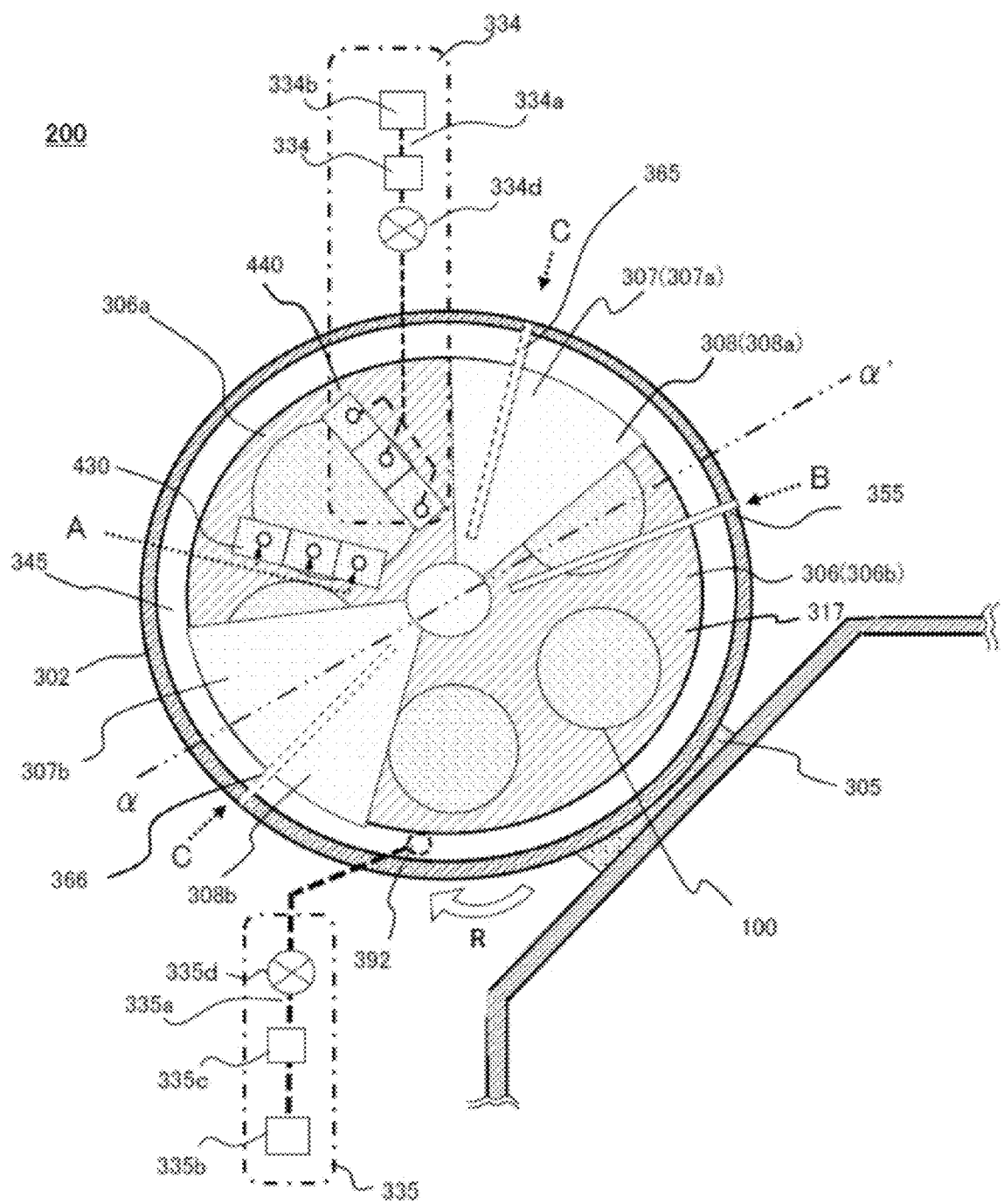
FIG. 10 is an explanatory view for explaining a substrate processing apparatus according to a second embodiment of the present disclosure.

In the second embodiment, as illustrated in FIG. 10, a gas supply structure 430 is used as the gas supply structure of the processing region 306a. Further, a gas exhaust structure 440 is used as the gas exhaust structure.

Subsequently, an apparatus configured to revolve the substrate 100 such as the substrate processing apparatus 200 will be described. As a result of intensive studies, the inventors have found that in the case of a revolution type apparatus, a concentration of a gas supplied to the substrate differs between the center side and the outer peripheral side of the substrate mounting plate 317. This is presumably because the moving speed of the substrate is different between an arbitrary point on the center side and an arbitrary point on the outer peripheral side.

Figure 13:
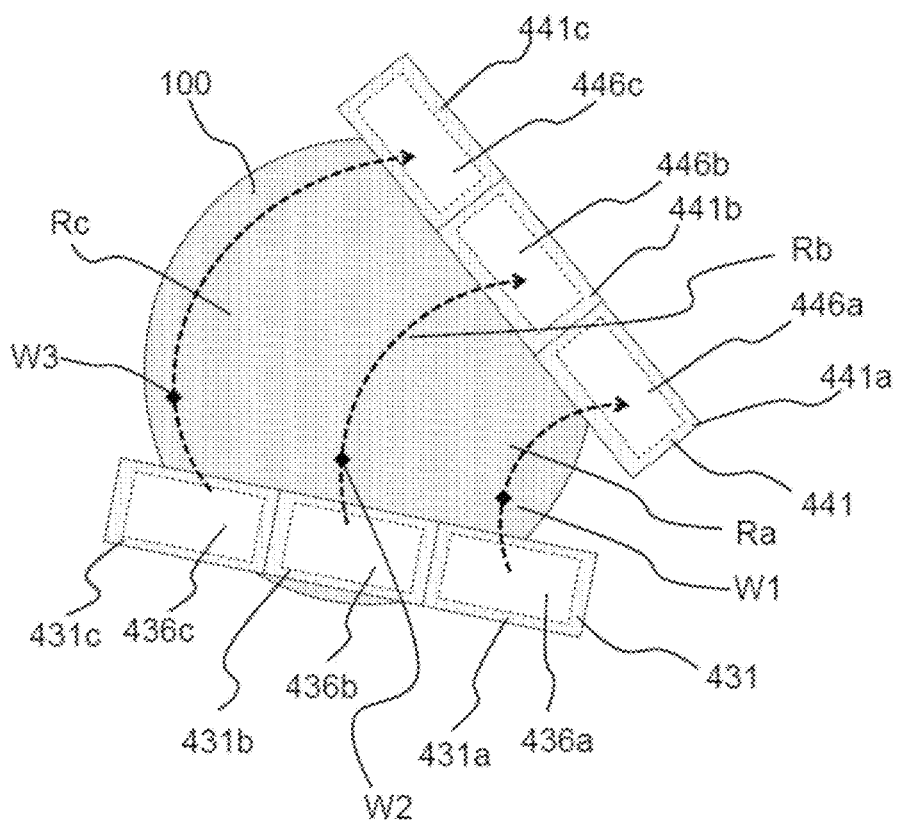
FIG. 13 is an explanatory view for explaining the gas supply structure and the gas exhaust structure according to the second embodiment.

To explain with reference to FIG. 13, than the moving distance of an arbitrary point W3 on the outer peripheral side of the substrate 100 is larger than the moving distance of an arbitrary point W1 on the center side of the substrate 100. This is because the point W3 moves faster than the point W1. When the gas supply amount on the center side of the substrate mounting plate 317 is equal to the gas supply amount on the outer peripheral side of the substrate mounting plate 317, since the gas supply time of the point W3 becomes short under a supply hole, the point W3 is shorter in the gas supply time than the point W1. As a result, a gas concentration at the point W3 is lower than a gas concentration at the point W1.

If the gas concentration, especially a concentration of gas main component, is different, the state of film such as a film thickness or the concentration of gas main component in the film may be different. This is because the amount of gas main component is different. Therefore, the yield may be reduced.

The technique according to the present embodiment is a technique for making the amount of gas main component uniform on the center side and the outer peripheral side of the substrate mounting plate 317, and specific examples thereof will be described below with a specific example thereof.

Figure 11:
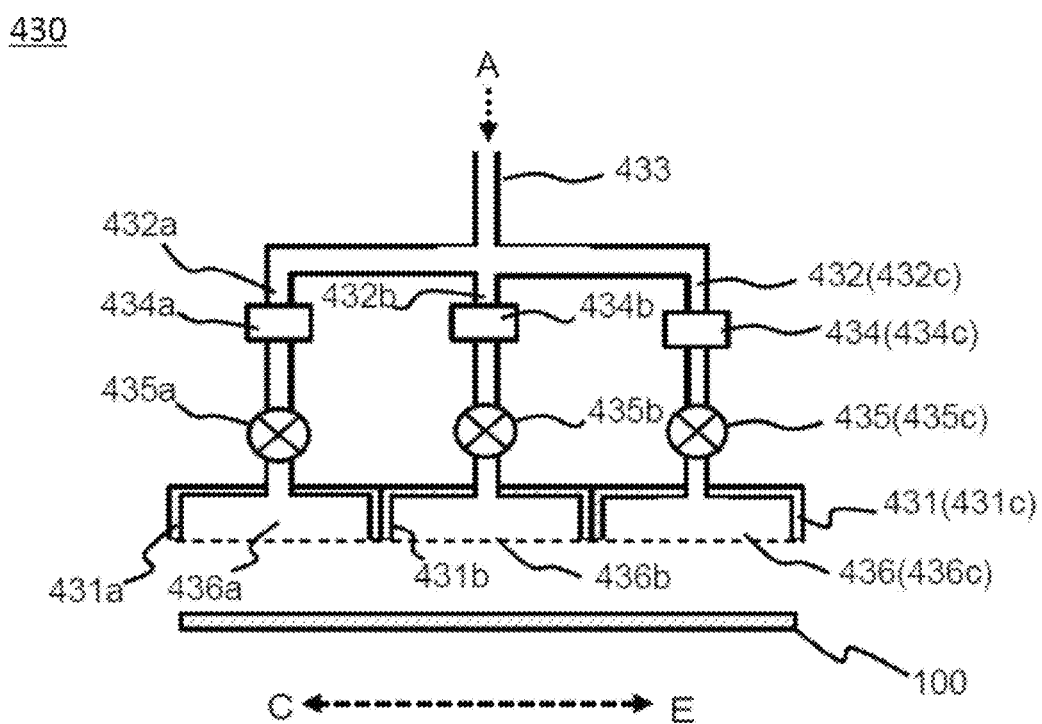
FIG. 11 is an explanatory view for explaining a gas supply structure according to the second embodiment.

The gas supply structure 430 will be described with reference to FIG. 11. The gas supply structure 430 includes a supply buffer structure 431 and a supply pipe 432 connected thereto. A plurality of supply buffer structures 431 are installed in the radial direction of the substrate mounting plate 317. In FIG. 11, supply buffer structures 431a, 431b and 431c are installed in this order from the center of the substrate mounting plate 317.

A hole 436 is formed in the lower surface of the supply buffer structure 431. A gas in the supply buffer structure 431 is supplied toward the substrate mounting plate 317 through the hole 436. The supply pipes 432 are installed corresponding to the respective supply buffer structures 431. A supply buffer structure 431a has a hole 436a to which a supply pipe 432a is connected. A supply buffer structure 431b has a hole 436b to which a supply pipe 432b is connected. A supply buffer structure 431c has a hole 436c to which a supply pipe 432c is connected. The supply buffer pipes 431 merges in the upstream and is connected to a junction pipe 433. The junction pipe 433 is connected to the first gas supply part 240.

At the supply pipe 432, an MFC 434 and a valve 435 are installed from the upstream side. An MFC 434a and a valve 435a are installed at the supply pipe 432a, an MFC 434b and a valve 435b are installed at the supply pipe 432b, and an MFC 434c and a valve 435c are installed at the supply pipe 432c, respectively.

With this configuration, the gas supply amount of the gas to be supplied to the substrate 100, that is, the amount of gas main component, can be controlled for each supply buffer structure 431.

Figure 12:
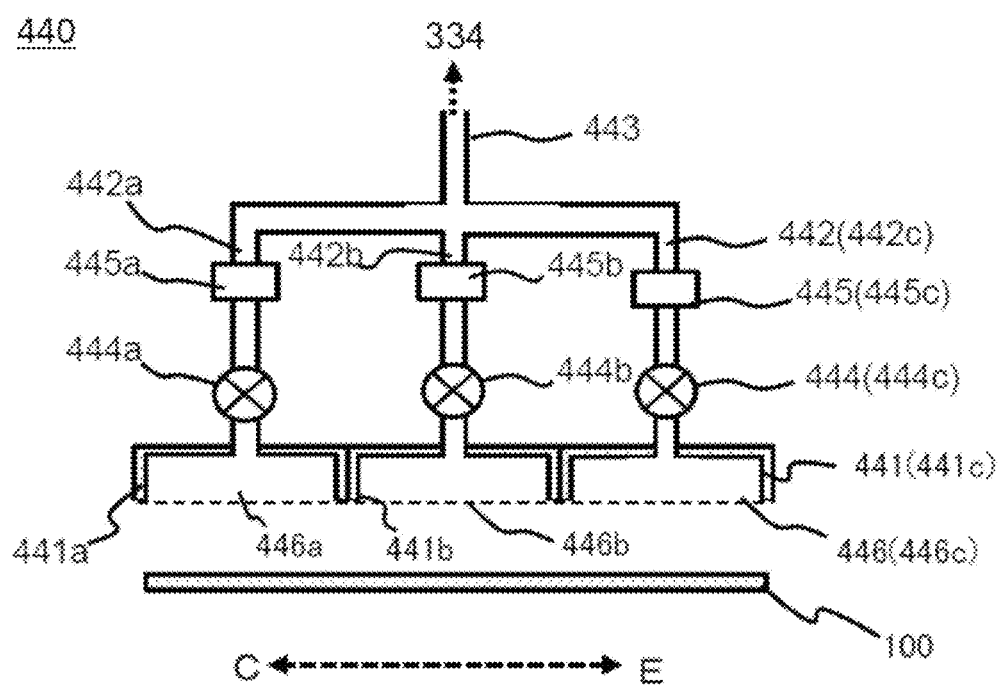
FIG. 12 is an explanatory view for explaining a gas exhaust structure according to the second embodiment.

Subsequently, the gas exhaust structure 440 will be described with reference to FIG. 12. The gas exhaust structure 440 includes an exhaust buffer structure 441 and an exhaust pipe 442 connected thereto. A plurality of exhaust buffer structures 441 are installed in the radial direction of the substrate mounting plate 317. In FIG. 12, exhaust buffer structures 441a, 441b and 441c are installed in this order from the center of the substrate mounting plate 317.

A hole 446 is formed in the lower surface of the exhaust buffer structure 441. A gas under the exhaust buffer structure 441 is moved into the exhaust buffer structure 441 through the hole 446. The exhaust pipes 442 are installed corresponding to the respective exhaust buffer structures 441. Specifically, an exhaust buffer structure 441a has a hole 446a to which an exhaust pipe 442a is connected. An exhaust buffer structure 441b has a hole 446b to which an exhaust pipe 442b is connected. An exhaust buffer structure 441c has a hole 446c to which an exhaust pipe 442c is connected. The respective exhaust pipes 442 are joined in the downstream and are connected to a junction pipe 443. The junction pipe 443 is connected to the first gas exhaust part 334.

At the exhaust pipe 442, a valve 444 and an APC valve 445 may be installed from the upstream side. A valve 444a and an APC valve 445a may be installed at the exhaust pipe 442a, a valve 444b and an APC valve 445b may be installed at the exhaust pipe 442b, and a valve 444c and an APC valve 445c may be installed at the exhaust pipe 442c.

With this configuration, the amount of gas exhausted can be controlled for each exhaust buffer structure 441.

Next, the relationship between the hole 436 of the supply buffer structure 431 and the hole 446 of the exhaust buffer structure 441 will be described with reference to FIG. 13. In the figure, W1, W2 and W3 denote arbitrary points on the substrate. An arbitrary point W1 indicates a point on the center side of the substrate mounting plate 317 in the substrate 100. An arbitrary point W2 indicates a point on the outer peripheral side of the substrate mounting plate 317 with respect to W1. An arbitrary point W3 indicates a point on the outer peripheral side of the substrate mounting plate 317 in the substrate 100 with respect to W2. A revolution orbit Ra indicates the orbit of the arbitrary point W1, a revolution orbit Rb indicates the orbit of the arbitrary point W2, and a revolution orbit Rc indicates the orbit of the arbitrary point W3.

As illustrated in FIG. 13, the holes 436 and the holes 446 correspond to each other on the revolution orbit of the substrate 100. Specifically, the hole 436a and the hole 446a correspond to each other on the revolution orbit Ra of the arbitrary point W1. The hole 436b and the hole 446b correspond to each other on the revolution orbit Rb of the arbitrary point W2. The hole 436c and the hole 446c correspond to each other on the revolution orbit Rc of the arbitrary point W3.

As described above, since the gas supply amount can be controlled in each supply buffer structure 431 and a gas exhaust amount can be controlled in each exhaust buffer structure 441, a gas flow can be individually formed between the corresponding supply buffer structure 431 and exhaust buffer structure 441, and the gas supply amount to the substrate 100 can be controlled. That is, the gas supply amount can be individually controlled on the center side and the outer peripheral side of the substrate mounting plate 317. Therefore, the amounts of gas main components can be individually controlled.

With such a structure, the gas supply amount on the outer peripheral side where the moving distance thereof is long can be made larger than that on the center side where the moving distance thereof is short. That is, at any point on the substrate, the supply amount of main component of a gas to be exposed can be made equal between the outer peripheral side and the center side. This can result in improvement in in-plane uniformity of the substrate 100 and increase in yield.

Further, since the moving distance of the substrate 100 gradually increases from the center to the outer periphery of the substrate mounting plate 317, for example, three or more supply buffer structures 431 and three or more exhaust buffer structures 441 may be installed as illustrated in FIG. 13. In this case, the gas supply amount corresponding to the moving distance can be more precisely controlled.

Since such control is possible, it is possible to process substrates having different surface areas. For example, even for a substrate having a larger surface area and a substrate having a smaller surface area, a supply amount of gas main component can be controlled according to their respective states.

In this case, a table obtained by comparing the state of the substrate with the supply amount of gas main component is stored in the storage part 403 in advance. Information on the state of a substrate 100 to be processed next, for example, surface area information, is received from the host device 520 and stored in the storage part 403. The CPU 401 compares the information with the table, reads a control value of the gas main component amount control part (or the gas main component amount controller) according to the information, and controls the gas main component amount control part.

In this way, even when substrates having different surface areas are processed, the in-plane uniformity of the substrate in each state can be improved, which can result in the increase in yield.

In the present disclosure, the substrate having the larger surface area refers to, for example, a substrate having a large number of circuit patterns such as a plurality of deep grooves, and the substrate having the small surface area refers to, for example, a substrate having a small number of circuit patterns such as a plurality of relatively shallow grooves.

Third Embodiment

Figure 14:
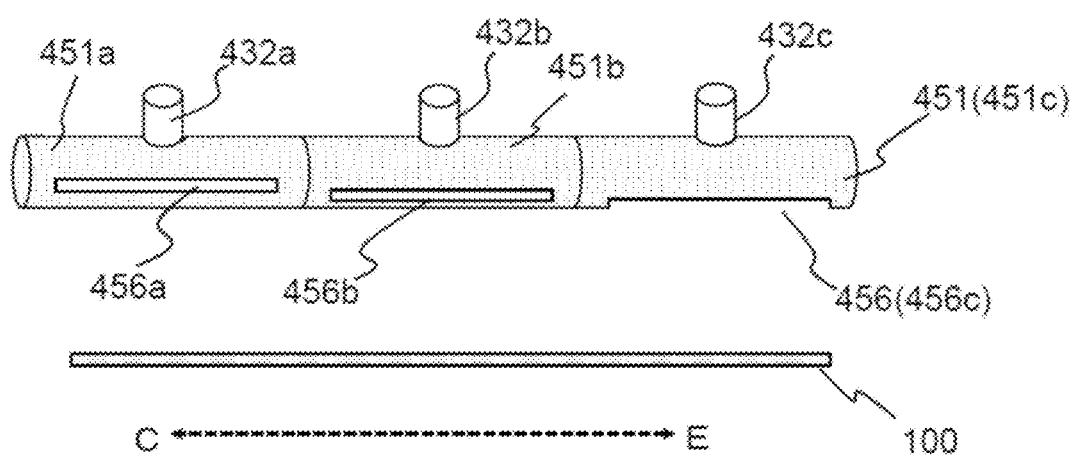
FIG. 14 is an explanatory view for explaining a gas supply structure according to a third embodiment of the present disclosure.

Subsequently, a third embodiment will be described with reference to FIGS. 14, 15A to 15C, and 16A to 16C. The third embodiment is different from the second embodiment in terms of the supply buffer structure in the apparatus form. Others have the same structure. Hereinafter, the differences will be mainly described. In FIG. 14, the direction of an arrow C indicates the center direction of the substrate mounting plate 317, and the direction of an arrow E indicates the outer peripheral direction of the substrate mounting plate 317. In FIG. 14, the rear side is an upstream side in the rotation direction, and the front side is a downstream side in the rotation direction.

Figure 15A:
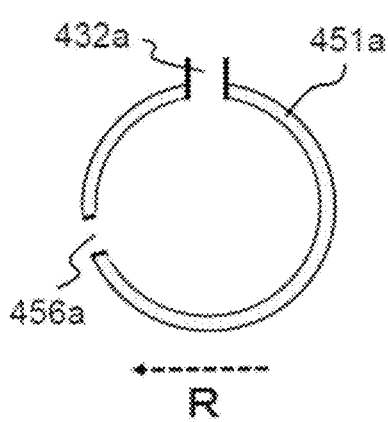
FIGS. 15A to 15C are explanatory views for explaining the gas supply structure according to the third embodiment.
Figure 15B:
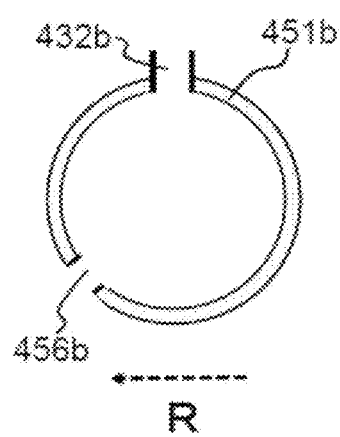
Figure 15C:
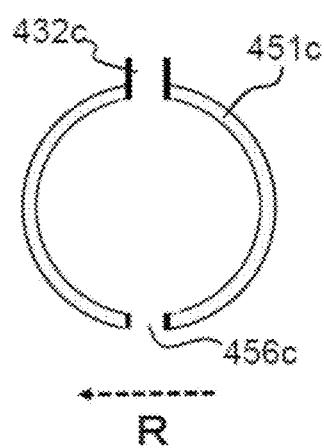

FIGS. 15A to 15C are explanatory views illustrating a relationship between a supply buffer structure 451 and a hole 456 to be described below. FIG. 15A illustrates a supply buffer structure 451a, FIG. 15B illustrates a supply buffer structure 451b, and FIG. 15C illustrates a supply buffer structure 451c. In FIGS. 15A to 15C, "R" denotes the rotation direction of the substrate mounting plate 317. The substrate 100 is moved below each supply buffer structure 451 in the R direction.

Figure 16A:
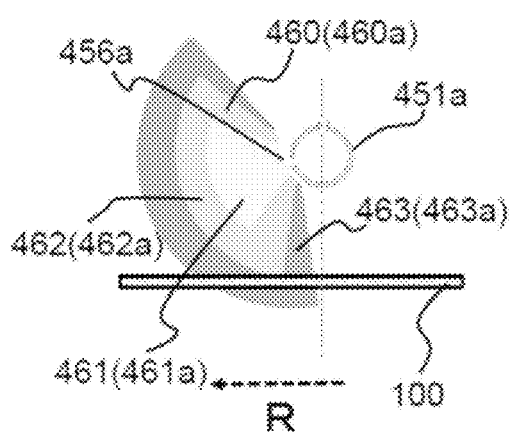
FIGS. 16A to 16C are explanatory views for explaining a relationship between the gas supply structure according to the third embodiment and supply of a gas to a substrate.
Figure 16B:
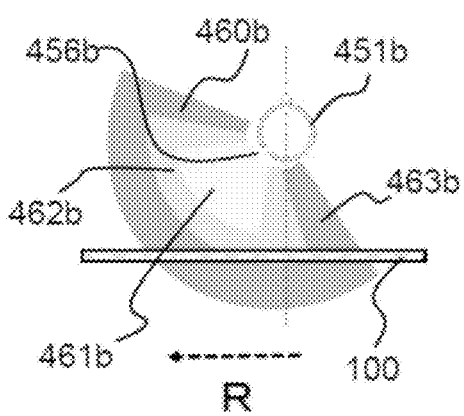
Figure 16C:
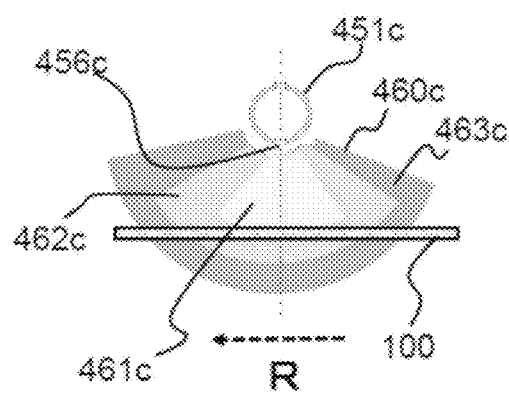

FIGS. 16A to 16C are explanatory views illustrating a relationship between each supply hole 456 and the concentration of the gas supplied to the substrate 100. The gas concentration is also referred to as a concentration of gas main component. In the figure, reference numeral 460 denotes a gas supplied from the hole 456. Further, in the gas 460, a portion having a high concentration closest to the hole 456 is denoted by 461, and portions denoted by 462 and 463 are sequentially set as a distance from the hole 456 increases. Since the gas 460 diffuses as the gas moves away from the hole 456, the gas concentration also decreases as the gas moves away from the supply hole 456. Therefore, the gas concentration becomes 461>462>463.

In FIGS. 16A to 16C, the substrate 100 is moved in the R direction under each buffer structure 451. Here, the point W1 passes under the buffer structure 451a, the point W2 passes under the buffer structure 451b, and the point W3 passes below the buffer structure 451c.

As described above, the point W1 indicates a point in the substrate 100 on the center side of the substrate mounting plate 317. The point W2 indicates a point in the substrate 100 on the outer peripheral side of the substrate mounting plate 317 with respect to W1. The point W3 indicates a point in the substrate 100 on the outer peripheral side of the substrate mounting plate 317 with respect to W2.

Next, a specific structure will be described. Similar to the supply buffer structure 431, a plurality of supply buffer structures 451 are installed from the center to the outer periphery of the substrate mounting plate 317. In FIG. 14, from the center side, the supply buffer structure 451a, the supply buffer structure 451b and the supply buffer structure 451c are installed in this order.

Each supply buffer structure 451 is connected to the supply pipe 432. The supply pipe 432a is connected to the supply buffer structure 451a, the supply pipe 432b is connected to the supply buffer structure 451b, and the supply pipe 432c is connected to the supply buffer 451c.

Each supply buffer structure 451 has the hole 456. The supply buffer structure 451a has a hole 456a, the supply buffer structure 451b has a hole 456b, and the supply buffer structure 451c has a hole 456c. A gas supplied to the supply buffer structure 451 is supplied to the substrate 100 via the hole 456.

As illustrated in FIGS. 15A to 15C, the openings of the holes 456 are formed at different inclination angles with respect to the surface of the substrate 100. For example, the hole 456a is formed to be parallel to the surface of the substrate 100 or face toward the substrate mounting plate 317. The hole 456c is formed to face toward a direction perpendicular to the surface of the substrate 100. The hole 456b is formed to have an angle between the angle of the hole 456a and the angle of the hole 456c. In this way, the opening direction of the hole 456 gradually face toward the surface of the substrate from the center to the outer periphery.

Subsequently, the concentration of the gas supplied to the substrate 100 in the above configuration will be described with reference to FIGS. 16A to 16C. As illustrated in FIGS. 16A to 16C, a distance between the supply hole 456 and the substrate 100 decreases as the supply hole 456 faces toward the substrate 100. As described above, the gas concentration increases as a distance from the supply hole decreases. In FIGS. 16A to 16C, since the supply hole 456 is closest to the substrate 100 in (c) and farthest from the substrate 100 in (a), when the supply buffer structure 451a, the supply buffer structure 451b, and the supply buffer structure 451c are at the same height as illustrated in FIG. 14, the concentration of the gas supplied to the substrate 100 may be (c)>(b)>(a).

As described above, in the revolution type apparatus, when the center side and the outer peripheral side of the substrate mounting plate 317 have the same supply amount, the amount of gas main component on the outer peripheral side decreases.

In the present embodiment, the gas concentration at the point W1 is controlled to be lower than the gas concentration at the point W3, and the supply amounts of gas main components at the points W1 and W3 are controlled to be the same. Thus, a process in the plane of the substrate 100 can be made uniform. Therefore, a film quality such as a film thickness and a concentration of main component in the film can be made uniform, which can result in the increase in yield.

Since such control is possible, it is possible to process substrates having different surface areas. For example, even for a substrate having a larger surface area and a substrate having a smaller surface area, the supply amount of gas main component can be controlled according to their respective states.

In this case, a table obtained by comparing the state of the substrate with the supply amount of gas main component is stored in the storage part 403 in advance. Information on the state of a substrate 100 to be processed next, for example, surface area information, is received from the host device 520 and stored in the storage part 403. The CPU 401 compares the information with the table, and reads a control value gas of the gas main component amount control part according to the information, and controls the gas main component amount control part.

In this way, even when the substrates having different surface areas are processed, the in-plane uniformity of the substrate in each state can be improved, which can result in the increase in yield.

Other Embodiments

The first to third embodiments of the present disclosure have been specifically described above. However, the present disclosure is not limited to the above-described embodiments, but may be modified in different ways without departing from the spirit and scope of the present disclosure.

In the present disclosure, a structure in which the gas supply structure 410 and the gas exhaust structure 420 are disposed in the first processing region and a configuration corresponding to the gas supply structure 410 and the gas exhaust structure 420 is not disposed in the second processing region 306b has been described as an example. This is because the reaction gas supplied to the second processing region has the following properties as an example. That is, this is an example in which the reaction gas has a property of being saturated or a property close to saturation when reacting with the precursor gas supplied to the first processing region.

Therefore, when the reaction gas has a property of being not saturated when reacting with the precursor gas, particularly a property that is far from the saturation, the configuration corresponding to the gas supply structure 410 and the gas exhaust structure 420 may be disposed in the second processing region 306b.

Further, the gas supply structure and the gas exhaust structure in the first embodiment may be divided into a plurality of supply buffer structures and exhaust buffer structures as in the second embodiment. Thus, the amount of gas main component can be adjusted more precisely.

In the present disclosure, the expression "the same" includes not only exactly the same but also substantially the same including some errors.

According to the embodiments of the present disclosure, it is possible to provide a technique capable of performing a uniform in-plane process of a substrate in an apparatus for processing the substrate while revolving the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device by a substrate processing apparatus in which a gas supply structure is disposed above a substrate mounting plate from a center to an outer periphery of the substrate mounting plate, a gas supplier includes the gas supply structure and is configured to control a supply amount of gas supplied from the gas supply structure, a gas exhaust structure is installed above the substrate mounting plate at a downstream side of the gas supply structure in a rotation direction, a gas exhauster includes the gas exhaust structure and is configured to control an exhaust amount of gas exhausted from the gas exhaust structure, and a gas main component amount controller includes the gas supplier and the gas exhauster and is configured to control an amount of a main component of gas supplied from the gas supply structure, the method comprising:

arranging a plurality of substrates on the substrate mounting plate in a circumferential direction;

starting rotating the substrate mounting plate;

starting supplying gas to the substrate mounting plate in a state where the gas main component amount controller controls the amount of the main component of the gas supplied to the plurality of substrates from the center to the outer periphery of the substrate mounting plate; and processing the plurality of substrates, wherein the gas supplier is configured to supply the gas from the gas supply structure in a state where a distance between the gas supply structure and the gas exhaust structure at a location through which middle regions of the plurality of substrates pass is set to be a first distance, and a distance between the gas supply structure and the gas exhaust structure at a location through which lateral regions of the plurality of substrates pass is set to be a second distance shorter than the first distance.

2. The method of claim 1, wherein, when the plurality of substrates is in a state where pillars forming a plurality of grooves are formed in a plane, the gas main component amount controller is configured to control such that an exposure amount of the gas supplied from the gas supply structure into the middle regions of the plurality of substrates is larger than an exposure amount of the gas supplied from the gas supply structure to the lateral regions of the plurality of substrates.

3. The method of claim 2, wherein the gas supplier is configured to supply the gas from the gas supply structure at a constant supply amount from the center to the outer periphery of the substrate mounting plate.

4. The method of claim 1, wherein the gas supplier is configured to supply the gas from the gas supply structure at a constant supply amount from the center to the outer periphery of the substrate mounting plate.

5. The method of claim 4, wherein the first distance and the second distance are set according to surface areas of grooves formed in the middle regions and the lateral regions.

6. The method of claim 3, wherein the first distance and the second distance are set according to surface areas of grooves formed in the middle regions and the lateral regions.

7. The method of claim 1, wherein the first distance and the second distance are set according to surface areas of grooves formed in the middle regions and the lateral regions.

8. The method of claim 1, wherein the gas supply structure includes a buffer space.

9. The method of claim 1, wherein the gas supply structure includes a hole, which is of a continuous shape.

10. The method of claim 1, wherein the gas supply structure includes a hole, which is of a U-shape.

11. The method of claim 1, wherein the gas supply structure includes a plurality of holes arranged along outer peripheries of the plurality of substrates.

12. The method of claim 1, wherein the gas exhaust structure includes a buffer space.

13. The method of claim 1, wherein the gas exhaust structure includes a hole, which is of a continuous shape.

14. The method of claim 1, wherein the gas exhaust structure includes a hole, which is of a U-shape.

15. The method of claim 1, wherein the gas exhaust structure includes a plurality of holes arranged along outer peripheries of the plurality of substrates.

16. The method of claim 1, wherein the gas supply structure includes a hole, which is of a U-shape whose gas-exhaust-structure side is released, and wherein the gas exhaust structure includes a hole, which is of a U-shape whose gas-supply-structure side is released.

* * * * *